(12) United States Patent
Dawson et al.

(10) Patent No.: US 8,090,476 B2
(45) Date of Patent: Jan. 3, 2012

(54) SYSTEM AND METHOD TO CONTROL DATA CENTER AIR HANDLING SYSTEMS

(75) Inventors: Christopher J. Dawson, Arlington, VA (US); Vincenzo V. Diluoffo, Sandy Hook, CT (US); Rick A. Hamilton, II, Charlottesville, VA (US); Michael D. Kendzierski, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 461 days.

(21) Appl. No.: 12/171,643

(22) Filed: Jul. 11, 2008

(65) Prior Publication Data

US 2010/0010678 A1 Jan. 14, 2010

(51) Int. Cl.
*G05B 13/00* (2006.01)
(52) U.S. Cl. .................. 700/276; 700/278; 700/291
(58) Field of Classification Search .................. 700/276, 700/291, 295, 296, 297, 299, 300; 702/60–63; 165/254, 266, 267
See application file for complete search history.

(56) References Cited

U.S. PATENT DOCUMENTS

| | | |
|---|---|---|
| 2,751,198 A | 6/1956 | Rapp |
| 3,516,347 A | 6/1970 | May |
| 3,690,243 A | 9/1972 | Lambert |
| 3,757,666 A | 9/1973 | Lambert |
| 3,835,606 A | 9/1974 | Liberman |
| 3,986,850 A | 10/1976 | Wilcox |
| 4,646,500 A | 3/1987 | Smith |
| 4,783,943 A | 11/1988 | Ljungkvist |
| 4,996,810 A | 3/1991 | Forde |
| 5,107,687 A | 4/1992 | Candeloro |
| 5,167,575 A | 12/1992 | MacDonald |
| 5,263,289 A | 11/1993 | Boyd |
| 5,467,607 A | 11/1995 | Harvey |
| 5,992,108 A | 11/1999 | Falcey |
| 6,033,301 A | 3/2000 | Suwa |
| 6,557,624 B1 | 5/2003 | Stahl et al. |
| 6,604,993 B1 | 8/2003 | Boniface |
| 6,862,179 B2 | 3/2005 | Beitelmal et al. |
| 6,885,115 B2 | 4/2005 | Hatori et al. |
| 6,983,210 B2 * | 1/2006 | Matsubayashi et al. ........ 702/60 |
| 6,991,533 B2 | 1/2006 | Tsai et al. |
| 7,214,131 B2 | 5/2007 | Malone |
| 7,259,963 B2 | 8/2007 | Germagian et al. |
| 7,266,964 B2 | 9/2007 | Vogel et al. |
| 7,304,477 B2 | 12/2007 | Konijn et al. |
| 7,373,268 B1 * | 5/2008 | Viredaz et al. ................ 702/130 |
| 7,447,920 B2 * | 11/2008 | Sharma et al. ................ 713/300 |

(Continued)

OTHER PUBLICATIONS

M. Kintner-Meyer, A. F. Emery, Optimal control of an HVAC system using cold storage and building thermal capacitance, Energy and Buildings, vol. 23, Issue 1, Oct. 1995, pp. 19-31.*

(Continued)

*Primary Examiner* — Dave Robertson
(74) *Attorney, Agent, or Firm* — John Pivnichny; Roberts Mlotkowski Safran & Cole, P.C.

(57) ABSTRACT

A method implemented in a computer infrastructure having computer executable code tangibly embodied on a computer readable medium being operable to determine at least one data center condition and determine or estimate a current energy cost. Additionally, the method includes dynamically control a heating, ventilation and air conditioning (HVAC) system of the data center based on the determined at least one data center condition and the determined or estimated current energy cost.

19 Claims, 5 Drawing Sheets

U.S. PATENT DOCUMENTS

| | | | |
|---|---|---|---|
| 7,596,431 B1 * | 9/2009 | Forman et al. | 700/299 |
| 7,620,613 B1 * | 11/2009 | Moore et al. | 706/62 |
| 7,640,760 B2 * | 1/2010 | Bash et al. | 62/178 |
| 7,644,148 B2 * | 1/2010 | Ranganathan et al. | 709/223 |
| 7,676,280 B1 * | 3/2010 | Bash et al. | 700/17 |
| 7,724,149 B2 * | 5/2010 | Kettler et al. | 340/584 |
| 7,783,390 B2 * | 8/2010 | Miller | 700/291 |
| 7,814,759 B2 * | 10/2010 | Rozzi et al. | 62/259.2 |
| 2003/0193777 A1 * | 10/2003 | Friedrich et al. | 361/687 |
| 2003/0224717 A1 | 12/2003 | Tsai et al. | |
| 2005/0159099 A1 | 7/2005 | Malone | |
| 2006/0015712 A1 | 1/2006 | Ang et al. | |
| 2006/0015866 A1 | 1/2006 | Ang et al. | |
| 2006/0073783 A1 | 4/2006 | Tsai et al. | |
| 2006/0076425 A1 | 4/2006 | Demster | |
| 2006/0260338 A1 | 11/2006 | VanGilder et al. | |
| 2007/0062685 A1 | 3/2007 | Patel et al. | |
| 2007/0080689 A1 | 4/2007 | Konijn et al. | |
| 2007/0125107 A1 * | 6/2007 | Beam | 62/186 |
| 2007/0146994 A1 | 6/2007 | Germagian et al. | |
| 2007/0213000 A1 | 9/2007 | Day | |
| 2008/0288193 A1 * | 11/2008 | Claassen et al. | 702/61 |
| 2009/0182812 A1 * | 7/2009 | Bajpay et al. | 709/205 |

OTHER PUBLICATIONS

S. Greenberg, E. Mills, W. Tschudi, P. Rumsey, and B. Myatt. Best practices for data centers: Lessons learned from benchmarking 22 data centers. ACEEE Summer Study on Energy Efficiency in Buildings, 2006.*

Mastroleon, L.; Bambos, N.; Kozyrakis, C.; Economou, D.; , "Automatic power management schemes for Internet servers and data centers," Global Telecommunications Conference, 2005. GLOBECOM '05. IEEE , vol. 2, no., pp. 5 pp., Nov. 28-Dec. 2, 2005.*

Jeffrey S. Chase, Darrell C. Anderson, Prachi N. Thakar, Amin M. Vandat, and Ronald P. Doyle. 2001. Managing energy and server resources in hosting centers. SIGOPS Oper. Syst. Rev. 35, 5 (Oct. 2001).*

Zhikui Wang, Niraj Tolia, and Cullen Bash. 2010. Opportunities and challenges to unify workload, power, and cooling management in data centers. SIGOPS Oper. Syst. Rev. 44, 3 (Aug. 2010), 41-46 (cited as background).*

Bash, C. E., Patel, C. D., Sharma, R. K., "Dynamic Thermal Management of Air Cooled Data Centers", Intersociety Conference on Thermal and Thermomechanical Phenomena in Electronic Systems, San Diego, CA, 2006.*

Justin Moore , Jeff Chase , Parthasarathy Ranganathan , Ratnesh Sharma, Making scheduling "cool": temperature-aware workload placement in data centers, Proceedings of the annual conference on USENIX Annual Technical Conference, p. 5-5, Apr. 10-15, 2005, Anaheim, CA.*

Burge, J.; Ranganathan, P.; Wiener, J.L.; , "Cost-aware scheduling for heterogeneous enterprise machines (CASH'EM)," Cluster Computing, 2007 IEEE International Conference on , vol., no., pp. 481-487, Sep. 17-20, 2007.*

Ratnesh K. Sharma, Rocky Shih, Cullen Bash, Chandrakant Patel, Philip Varghese, Mohandas Mekanapurath, Sankaragopal Velayudhan, and Manu Kumar, V. 2008. On building next generation data centers: energy flow in the information technology stack. In Proceedings of the 1st Bangalore Annual Compute Conference (COMPUTE'08), 7 pages.*

Sharma, Ratnesh K.; Bash, Cullen E.; Patel, Chandrakant D.; Friedrich, Richard J.; Chase, Jeffrey S. Balance of Power: Dynamic Thermal Management for Internet Data Centers. HPL-2003-5, 2003 [downloaded Nov. 19, 2010]. Retrieved from http://www.hpl.hp.com/techreports/2003/HPL-2003-5.html.*

Xiaobo Fan, Wolf-Dietrich Weber, and Luiz Andre Barroso. 2007. Power provisioning for a warehouse-sized computer. SIGARCH Comput. Archit. News 35, 2 (Jun. 2007), 13-23.*

Sharma, R.K.; Bash, C.E.; Patel, C.D.; Friedrich, R.J.; Chase, J.S.; , "Balance of power: dynamic thermal management for Internet data centers," Internet Computing, IEEE , vol. 9, No. 1, pp. 42- 49, Jan.-Feb. 2005.*

Appleby, K.; Fakhouri, S.; Fong, L.; Goldszmidt, G.; Kalantar, M.; Krishnakumar, S.; Pazel, D.P.; Pershing, J.; Rochwerger, B.; , "Oceano-SLA based management of a computing utility," Integrated Network Management Proceedings, 2001 IEEE/IFIP International Symposium on , vol., no., pp. 855-868, 2001.*

J. Moore, J. Chase, K. Farkas, and P. Ranganathan. Data center workload monitoring, analysis, and emulation. In Eighth Workshop on Computer Architecture Evaluation using Commercial Workloads, Feb. 2005.* http://www.tateaccessfloors.com/documentation_green.htm; pp. 1 - 2.

Alex Frangos; "Raised-Floor Ventilation Gains Footing in Offices"; URL: http://www.realestatejournal.com/propertyreport/office/20030714-frangos.html; pp. 1-2.

Kevin Epstein, et al.; "Double Jeopardy in a 'Slow' Disaster Computing Data Center Challenges in a Pandemic World"; URL: http://www.scalent.com/html/company/News/drj_spring07.pdf?item=21900; Spring 2006; pp. 50-51.

Ron Anderson; Increased power and cooling requirements are creating intensified demand for data-center redesigns; URL: http://i.cmpnet.com/v3.businessinnovation.cmp.com/pdfs/nwca_datacenter_report.pdf ; Aug. 2006; pp. 1-24.

"Data Center Cooling, Server Room Cooling & Rack Cooling Solutions"; URL: http://www.42u.com/42u-rack-cooling.htm; pp. 1-3.

"Flow Modeling Solutions for Data Centers"; URL: http://www.fluent.com/solutions/data_centers/index.htm; p. 1.

* cited by examiner

SYSTEM AND METHOD TO CONTROL DATA CENTER AIR HANDLING SYSTEMS

FIELD OF THE INVENTION

The present invention generally relates to data centers, and more particularly, to a method and system to proactively control data center air handling systems to increase energy efficiency.

BACKGROUND

A traditional data center conventionally includes a plurality of individual computing resources. A data center (or other physical space) beneficially has, where possible, an optimized heating and cooling infrastructure. Maintaining data centers at desired temperatures (e.g., set points) helps prevent computer hardware (e.g., information technology (IT) infrastructure) from overheating and malfunctioning. To this end, many data centers are maintained or cooled to relatively low temperatures (e.g., 65° F.) to increase equipment reliability and useful life, and to avoid downtime for repair and/or replacement.

Moreover, data center temperatures are routinely changing, depending on which IT equipment is running at any given time. For example, some IT infrastructure of the data center may run during the day, while other IT infrastructure of the data center may operate at night. To accommodate such moving hot spot targets, existing systems resort to a sort of 'overkill' by cooling the entire volume of the data center to well below the set point and/or cooling the data center at all times, which increases operational costs. Moreover, with the increasing awareness and desire to operate in a green manner, such excessive use of energy is undesirable.

Additionally, in data centers the air heating and cooling infrastructure, e.g., a heating, ventilation, and air conditioning (HVAC) system, may commence operation upon sensing a change in temperature in the data center. That is, instead of the HVAC system running constantly, the HVAC system may be run intermittently. For example, the temperature of the data center may rise due to the operation of IT infrastructure in the data center. The rise in temperature may be detected, e.g., by a thermostat, and the HVAC system may commence operation to produce cooling air to react to the rising data center temperature. However, reactively addressing the resultant rise in data center temperatures may be inefficient and may increase data center costs.

Moreover, energy costs may fluctuate, e.g., throughout a given day, throughout a season, throughout a year, etc., based on, for example, energy demand. For example, energy demand (and energy costs) may be lower during the middle of the night. Conversely, energy demand (and energy costs) may be highest during the middle of the day. However, conventional data centers, which provide a constant data center temperature or provide reactionary cooling (i.e., cooling in response to a detected rise in data center temperature), do not account for and/or leverage current energy costs. Thus, conventional data center air systems may be inefficient and may increase data center costs.

Accordingly, there exists a need in the art to overcome the deficiencies and limitations described hereinabove.

SUMMARY

In a first aspect of the invention, a method implemented in a computer infrastructure having computer executable code tangibly embodied on a computer readable medium is operable to determine at least one data center condition and determine or estimate a current energy cost. Additionally, the method comprises dynamically control a heating, ventilation and air conditioning (HVAC) system of the data center based on the determined at least one data center condition and the determined or estimated current energy cost.

In another aspect of the invention, a system comprises at least one of an environmental data monitoring tool configured to perform an environmental analysis of a data center, a workload measurement tool configured to determine a current data center workload, a job schedule monitoring tool configured to determine and track a scheduled data center job and an energy cost monitoring tool configured to determine or estimate a current energy cost. Further, the system comprises a heating, ventilation and air conditioning (HVAC) control tool configured to dynamically control a heating, ventilation and air conditioning (HVAC) system of the data center based on information received from the at least one of the environmental data monitoring tool, the workload measurement tool, the job schedule monitoring tool and the energy cost monitoring tool.

In an additional aspect of the invention, a computer program product comprising a computer usable medium having readable program code embodied in the medium is provided. The computer program product includes at least one component operable to determine at least one data center condition and determine or estimate a current energy cost. Additionally, the at least one component is operable to dynamically control a heating, ventilation and air conditioning (HVAC) system of the data center based on the determined at least one data center condition and the determined or estimated current energy cost to at least one of proactively pre-cool the data center and cool the data center during periods of lower energy costs.

In a further aspect of the invention, a method comprises providing a computer infrastructure operable to determine at least one data center condition and determine or estimate a current energy cost. Additionally, the computer infrastructure is operable to dynamically control a heating, ventilation and air conditioning (HVAC) system of the data center based on the determined at least one data center condition and the determined or estimated current energy cost to at least one of proactively pre-cool the data center and cool the data center during periods of lower energy costs. Furthermore, the computer infrastructure is operable to update at least one of the determined at least one data center condition, the determined or estimated current energy cost and the dynamic control of the HVAC system based on at least one of an expiration of a predetermined time period, a manual direction and an occurrence of a triggering event.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
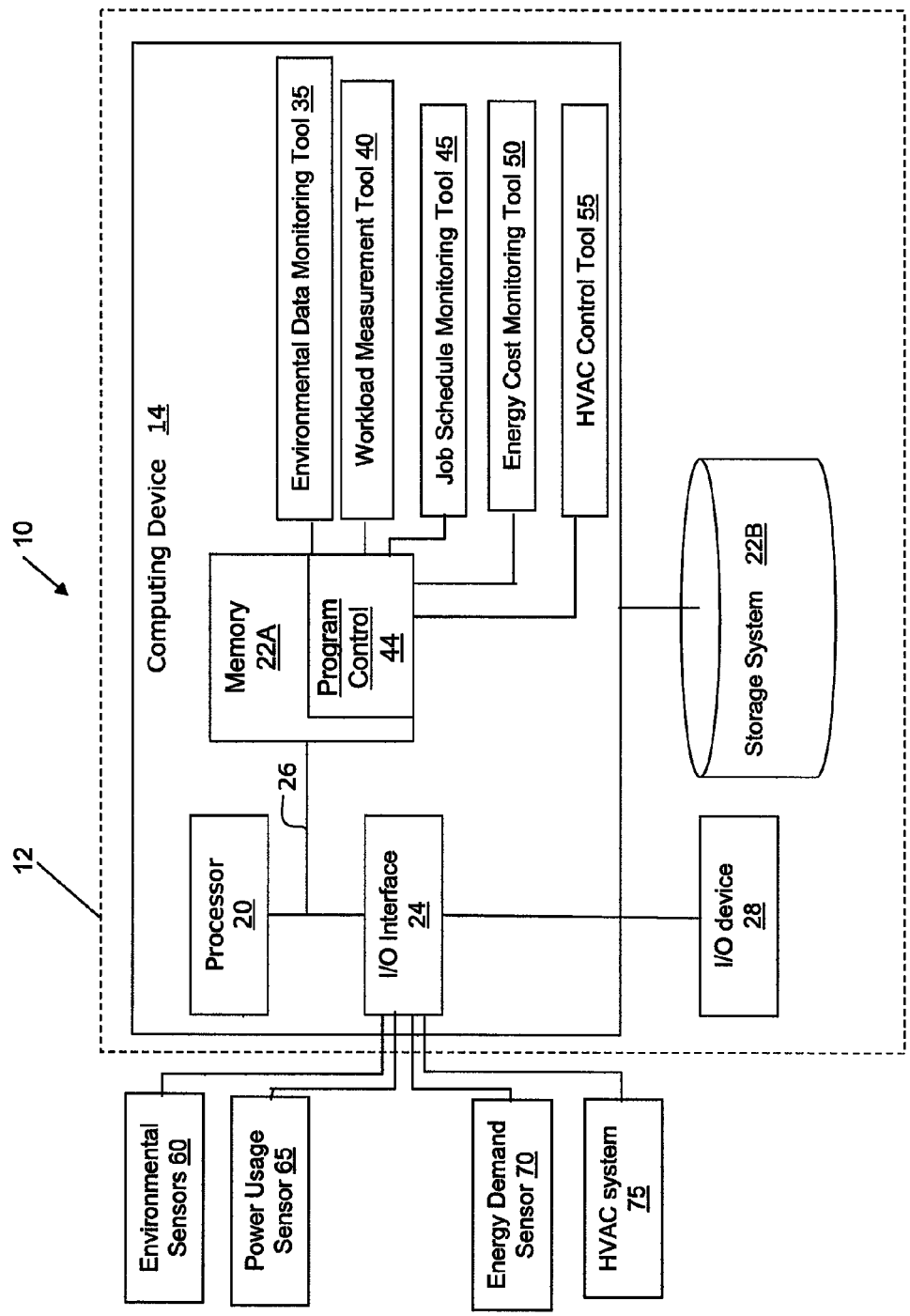
FIG. 1 shows an illustrative environment for implementing steps in accordance with the invention.

The present invention generally relates to data centers, and more particularly, to a method and system to proactively control data center air handling systems to increase energy efficiency. The present invention provides a system and method to dynamically control heating, ventilation, air conditioning (HVAC) systems and other air control systems to proactively, e.g., cool a data center environment. The present invention provides a system and method to intelligently pre-cool different regions within the data center in the anticipation of future heavy information technology (IT) processing workload that would normally require excess energy costs and usage from the HVAC and air control systems. Moreover, the present invention is configured to schedule the HVAC and air control systems to provide cool air towards infrastructure components or a data center region based on application workload requirements and current energy costs.

Implementing the present invention, through pre-cooling a data center space in anticipation of future workload, offers reduced power consumption and optimization of data center infrastructure energy usage. That is, by adapting to the data center energy model where the energy costs for cooling or mediating the temperature of the data center are lower, this may balance off the need for heavy usage of the HVAC or air control systems while the energy costs are higher. For example, by using the air control systems to proactively lower the temperature within the data center or data center region during periods of lower energy costs, during peak loads (with corresponding higher energy costs) the air control system may be utilized to a lesser extent, thus consuming less energy.

Furthermore, by dynamically controlling the HVAC and air control systems to pre-cool the data center, the IT infrastructure may benefit from the cooler temperatures by limiting any availability problems brought on by overheating within the data center. Additionally, implementing the present invention may lower the energy costs within a data center, for example, by utilizing the HVAC and air control systems while they are using the least amount of energy, e.g., due to a pre-cooling, or while energy costs are at their lowest possible point.

By using the present invention to lower the temperature of the data center by coordinating the different infrastructure systems, application job scheduling and air control systems, this may maximize the energy efficiencies of the data center environment by only using as much cool air as necessary and coordinating the activities between air control systems and application workload together. Moreover, by forecasting a need for cooler air within the data center to meet the IT processing requirements, and by using energy while it is at a lower cost, the HVAC or air control systems may not have to run as long or may be able to run at levels that reduce the energy costs and improve overall energy usage within the data center.

System Environment

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following:

- an electrical connection having one or more wires,
- a portable computer diskette,
- a hard disk,
- a random access memory (RAM),
- a read-only memory (ROM),
- an erasable programmable read-only memory (EPROM or Flash memory),
- an optical fiber,
- a portable compact disc read-only memory (CDROM),
- an optical storage device, and/or
- a transmission media such as those supporting the Internet or an intranet, or a magnetic storage device.

The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. (Java is a trademark of Sun Microsystems, Inc. in the United States, other countries, or both.) The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network. This may include, for example, a local area network (LAN) or a wide area network (WAN), or the connection may be made to an external computer (for example, through the Internet using an Internet Service Provider).

FIG. 1 shows an illustrative environment 10 for managing the processes in accordance with the invention. To this extent, the environment 10 includes a computer infrastructure 12 that can perform the processes described herein using a computing device 14. The computing device 14 includes an environmental data monitoring tool 35, a workload measurement tool 40, a job schedule monitoring tool 45, an energy cost monitoring tool 50 and an HVAC control tool 55. These tools are operable to perform monitor environmental conditions of a data center, monitor current workloads of the data center, monitor scheduled jobs for the data center, determine or estimate current energy costs and control an HVAC system 75 based on the determined information, e.g., the processes described herein, under control of program control 44.

The computing device 14 includes a processor 20, a memory 22A, an input/output (I/O) interface 24, and a bus 26. The memory 22A can include local memory employed during actual execution of program code, bulk storage, and cache memories which provide temporary storage of at least some program code in order to reduce the number of times code must be retrieved from bulk storage during execution.

Further, the computing device 14 is in communication with an external I/O device/resource 28. The I/O device 28 can interact with the computing device 14 or any device that enables the computing device 14 to communicate with one or more other computing devices using any type of communications link. The external I/O device/resource 28 may be keyboards, displays, pointing devices, etc. Additionally, in embodiments, the computing device 14 includes a storage system 22B. Moreover, as shown in FIG. 1 and explained further below, the computing device 14 is in communication with a plurality of temperature sensors 60, a power usage sensor 65, an energy demand sensor 70 and the HVAC system 75.

The processor 20 executes computer program code (e.g., program control 44) processes on computer media, which is stored in memory 22A and/or storage system 22B. While executing computer program code, the processor 20 can read and/or write data to/from memory 22A, storage system 22B, and/or I/O interface 24. The bus 26 provides a communications link between each of the components in the computing device 14.

The computing device 14 can comprise any general purpose computing article of manufacture capable of executing computer program code installed thereon (e.g., a personal computer, server, handheld device, etc.). However, it is understood that the computing device 14 is only representative of various possible equivalent computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 12 is only illustrative of various types of computer infrastructures for implementing the invention. For example, in embodiments, the computer infrastructure 12 comprises two or more computing devices (e.g., a server cluster) that communicate over any type of communications link, such as a network, a shared memory, or the like, to perform the processes described herein. Further, while performing the processes described herein, one or more computing devices in the computer infrastructure 12 can communicate with one or more other computing devices external to computer infrastructure 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

In embodiments, the invention provides a business method that performs the steps of the invention on a subscription, advertising, and/or fee basis. That is, a service provider, such as a Solution Integrator, could offer to perform the processes described herein. In this case, the service provider can create, maintain, deploy, support, etc., a computer infrastructure that performs the process steps of the invention for one or more customers. In return, the service provider can receive payment from the customer(s) under a subscription and/or fee agreement and/or the service provider can receive payment from the sale of advertising content to one or more third parties.

Monitoring Data Center Conditions

According to an aspect of the invention, in order to proactively cool the data center during times where energy costs may be lower and/or in anticipation of heavy workload, the present invention may monitor data center conditions. Data center conditions may generally include, for example, data center environmental conditions and data center application work load conditions.

More specifically, in embodiments, the environmental data monitoring tool 35 may monitor data center environmental data received, e.g., from the environmental sensors 60. In embodiments, the environmental data may include outdoor (ambient) temperature, data center temperature, time of day, mean temperature within a data center region, humidity, moisture, airflow and carbon emissions, amongst other environmental data. Accordingly, the environmental sensors 60 may include, for example, temperature sensors, humidity sensors, moisture sensors, airflow sensors and carbon emissions sensors, amongst other sensors. The environmental data monitoring tool 35 may assess the environmental variables, e.g., on predetermined or dynamically determined intervals via the environmental sensors 60. As discussed further below, the environmental data monitoring tool 35 may forward this environmental data to the HVAC control tool 55. Moreover, in embodiments, each environmental variable may include a time stamp to optimize the dynamic HVAC control.

Further, the environmental monitoring tool 35 may perform and utilize environmental snapshots to, e.g., establish a baseline and/or to determine the optimum workload and job scheduling characteristics. For example, the snapshots may provide appropriate or target data center environmental conditions. Thus, according to an aspect of the invention, the environmental monitoring tool 35 and/or the HVAC control tool 55, for example, may utilize the snapshots to determine an appropriate amount of cooling based on current data center environmental conditions. In embodiments, the environmental snapshots may be stored in a database, e.g., storage system 22B.

In addition to the data center environmental conditions, the present invention may monitor data center workload levels and system variables. In embodiments, data center workload levels may include both current workload levels and future workload levels due to future scheduled jobs. System variables may include but are not limited to power usage, application priority, job scheduling and application type. In embodiments, each workload variable and system variable may include a time stamp to optimize the dynamic HVAC control.

According to an aspect of the invention, the workload measurement tool 40 may monitor a current data center workload. In embodiments, the workload measurement tool 40 may determine a current data center workload based on, for example, power usage data received from power usage sensors 65. The workload measurement tool 40 may assess the workload and system variables, e.g., on predetermined or dynamically determined intervals via, e.g., the power usage sensor 65. As discussed further below, the workload measurement tool 40 may forward this workload data to the HVAC control tool 55.

Additionally, in embodiments, the job schedule monitoring tool 45 may track future scheduled data center jobs and forward this information to the HVAC control tool 55, as discussed further below. In embodiments, the job schedule monitoring tool 45 may access a stored job schedule in, e.g., the storage system 22B. Furthermore, a user, e.g., a data center employee, may input job schedule information or update job schedule information via the job schedule monitoring tool 45. In embodiments, the job schedule monitoring tool 45 may assess the workload and system variables, for example, stored in the storage system 22B, e.g., on predetermined or dynamically determined intervals. Moreover, as discussed further below, the job schedule monitoring tool 45 may forward this workload data to the HVAC control tool 55.

Further, the workload measurement tool 40 and/or the job schedule monitoring tool 45 may perform and utilize system snapshots to, e.g., establish a baseline and/or to determine the optimum workload and job scheduling characteristics. For example, the snapshots may provide appropriate or target data center workload conditions, e.g., particular jobs or an amount of workload, e.g., as a percentage of total data center capacity, amongst other data center workload conditions. Thus, according to an aspect of the invention, the workload measurement tool 40, the job schedule monitoring tool 45 and/or the HVAC control tool 55, for example, may utilize the snapshots to determine an appropriate amount of cooling based on current data center workload conditions. In embodiments, the system snapshots may be stored in a database, e.g., storage system 22B.

Monitoring Current Energy Costs

According to a further aspect of the invention, the energy cost monitoring tool 50 may determine or estimate current energy costs or demand. Throughout a given day, for example, energy costs may vary based on, e.g., a current energy demand. That is, there may be periods of high energy demand and lower energy demand with associated respective higher and lower energy costs. For example, a higher energy demand may be experienced during the peak of the day when, e.g., temperatures may be higher or more people may be actively using electricity. Conversely, a lower energy demand may be experienced, for example, during the morning, the evening and/or throughout the night, when people may be less active or sleeping.

Thus, the energy cost monitoring tool 50 may monitor and determine or estimate energy demand and/or energy costs, such that the HVAC control tool 55 may utilize energy for, e.g., cooling the data center, when energy costs may be lower. In embodiments, the energy cost monitoring tool 50 may determine a current energy demand via an energy demand sensor 70. In embodiments, the energy demand sensor 70 may be connected to, e.g., an electrical power grid supplying the data center, such that the energy demand sensor 70 may determine a current energy demand. For example, the energy demand sensor 70 may provide real time feeds for peak loads (e.g., hot summer days and AC units running). Additionally, in embodiments, the energy cost monitoring tool 50 may maintain historical energy demand/cost data for the data center in a database, e.g., storage system 22B. Thus, the energy cost monitoring tool 50 may utilize the historical energy demand/cost data to perform a trending analysis and estimate future energy demand/costs. For example, the energy cost monitoring tool 50 may determine from the historical energy demand/cost data that energy demand, and consequently energy cost, on average experiences, e.g., an increase between eight o'clock in the morning and six o'clock in the evening on weekdays. Thus, the energy cost monitoring tool 50 may estimate, based on the historical demand/cost data, periods of lower energy demand (and cost) on a given day. Moreover, this information may be forwarded to the HVAC control tool 55, as discussed further below.

HVAC Control

According to a further aspect of the invention, the HVAC control tool 55 may utilize the information from the environmental data monitoring tool 35, the workload measurement tool 40, the job schedule monitoring tool 45 and the energy cost monitoring tool 50 in order to determine, for example, an optimal time to run the HVAC system 75. More specifically, the information from the environmental data monitoring tool 35, the workload measurement tool 40, the job schedule monitoring tool 45 and/or the energy cost monitoring tool 50 may all become determining factors as to where and what to pre-cool in order to limit future energy costs and heavy usage of the HVAC system 75. It should be understood that the HVAC system 75 includes the data center HVAC system and other data center air control systems, e.g., air purification/filter systems.

In embodiments, this entails controlling the data center HVAC system 75 via the HVAC control tool 55 based on, for example, the application workload measurements, the determined or estimated energy costs per time period, the determined environmental data and/or the upcoming job scheduling requirements so that the HVAC system 75 may be activated in an intelligent manner to anticipatorily cool the data center, e.g., during a period of lower energy costs and/or before the cooling may be needed.

The HVAC control tool 55 may, in embodiments, respond to, for example, the infrastructure components that are scheduled to process an application, determined via the job schedule monitoring tool 50, and/or a current workload within the data center, determined via the workload measurement tool 40, by pre-cooling the data center. By pre-cooling the data center, e.g., in anticipation of an upcoming data center job, the HVAC system 75 may not have to work as hard to cool the data center as compared to the work required to cool the data center when reacting to the increased workload, and increased temperature within the data center caused thereby, as the temperature increases. That is, instead of reacting to the trigger of a temperature ceiling to begin cooling the data center, the present invention may initiate a pre-cooling sequence where the coordination of the different HVAC units and air control systems of the HVAC system 75 would begin lowering the temperature of the data center prior to a trigger of the temperature ceiling.

For example, a scheduled long-running job may be scheduled to be executed in a data center in the near future, e.g., in two hours. As discussed above, the job schedule monitoring tool 45 is aware of the scheduled job and may forward this information to the HVAC control tool 55. Additionally, the energy cost monitoring tool 50 is aware based on, e.g., real-time energy costs or historical energy costs, that energy costs are presently low and that energy costs will be higher when the scheduled job will be executed in two hours. Accordingly, the HVAC control tool 55 may activate the HVAC system 75 to pre-cool the area within the data center in which the job will run.

According to aspects of the invention, the advantages of proactively cooling the data center may be at least two-fold. First, by cooling the data center during a period of reduced energy demand, the associated costs for cooling the data center may be lower. Moreover, by cooling the data center before the job begins to execute, the HVAC system 75 may only need to cool the data center from a lower initial temperature. That is, once the job begins to execute, the temperature in the data center may begin to increase, for example, due to the heat generated by, e.g., the data center processors. Thus, if the HVAC system 75 is only activated once the job begins to execute, the HVAC system 75 may require more energy and incur higher costs to keep the data center at an appropriate temperature.

However, by commencing cooling before the job begins to execute, the initial temperature in the data center may be lowered, therefore reducing the amount of future work necessary to moderate the temperature within the data center. That is, after the pre-cooling, the HVAC system 75 may only need to produce a lower amount of cooling to maintain the data center at an appropriate temperature, e.g., during the scheduled job. Moreover, by reducing the amount of work that the HVAC system 75 may have to perform, using lower energy costs and an orchestration of different systems, this will reduce the amount of work that the HVAC system 75 will perform as the IT processing workload increases, and consequently will reduce the cooling costs. This may maximize the energy efficiencies of the data center environment, for example, by only using as much cool air as necessary and coordinating the activities of the HVAC system 75 and application workload together.

In further embodiments, the HVAC control tool 55 may preempt a scheduled job and activate the HVAC system 75 to pre-cool the area within the data center in which the job will run. That is, instead of (or in addition to) proactively cooling the data center early, in embodiments, the HVAC control tool 55 may delay a scheduled job in order to cool the data center prior to executing the scheduled job. For example, the HVAC control tool 55 may determine based on the received information from the environmental data monitoring tool 35, the workload measurement tool 40, the job schedule monitoring tool 45 and/or the energy cost monitoring tool 50, that it would be more efficient to delay the scheduled job to pre-cool the data center, as compared executing the scheduled job without delay and running the HVAC system 75 concurrently.

Updating the Monitoring of Data Center Conditions, Current Energy Costs and HVAC Control Additionally, in embodiments, the monitoring of the data center conditions and the current energy costs may be updated, and the HVAC system 75 may be controlled accordingly. More specifically, the environmental data monitoring tool 35 may perform an updated analysis of the data center environmental conditions. Additionally, the workload measurement tool 40 may perform an updated analysis of the data center workload and the job schedule monitoring tool 45 may perform an updated analysis of the data center scheduled jobs. Further, the energy cost monitoring tool 50 may perform an updated analysis of the current energy costs. In accordance with an aspect of the invention, this updated information may be forwarded to the HVAC control tool 55, and the HVAC control tool 55 may control the HVAC system 75 in accordance with the updated information.

According to an aspect of the invention, the update may be performed on predetermined or dynamically determined intervals. For example, in embodiments, the time period for performing an update may be predetermined, such that upon expiration of the predetermined time period, an update is automatically performed. It should be understood that the predetermined time period may be user-configurable. Additionally, in embodiments, the update may be performed at dynamically determined intervals. For example, a user may manually trigger an update.

Additionally, the invention contemplates that a triggering event may trigger an update of information. For example, in embodiments, the energy cost monitoring tool 45 may monitor current energy costs on an ongoing manner in real-time. Moreover, the energy cost monitoring tool 45 may be configured to trigger an updated analysis of, e.g., the data center environmental conditions, the data center workload conditions and/or the data center scheduled jobs and/or update the control of the HVAC system 75, if for example, the energy cost monitoring tool 45 determines a change in energy costs (as compared to the previously determined energy costs) exceeding a predefined, user-configurable percentage, e.g. fifteen percent. Additionally, any of the environmental data monitoring tool 35, the workload measurement tool 40 and the job schedule monitoring tool 45 may be configured in a similar manner to trigger an update of the other tools when a change of current conditions as compared to the previously monitored conditions exceeds some predetermined user-configurable threshold.

In further embodiments, each of the environmental data monitoring tool 35, the workload measurement tool 40, the job schedule monitoring tool 45 and the energy cost monitoring tool 50 may monitor current conditions in an ongoing manner in real-time. If any change of the monitored conditions exceeds a predefined amount, for example, a predefined, user-configurable percentage, e.g. fifteen percent, as compared to the previous monitored condition, the respective tool may trigger the HVAC control tool 55 to update control of the HVAC system 75 in accordance with the newly monitored conditions.

Furthermore, it should be understood that, in embodiments, some of the measured conditions may not be updated as frequently or updated upon the occurrence of a triggering event. For example, energy costs may experience greater fluctuation, such that more frequent updating of the energy costs may be appropriate or necessary. Thus, in embodiments, the invention contemplates that an update may be performed more frequently for at least one of the data center environmental conditions, the data center workload conditions, the data center scheduled jobs, and the energy cost determination, as compared to the other conditions.

Exemplary Embodiment

Figure 2:
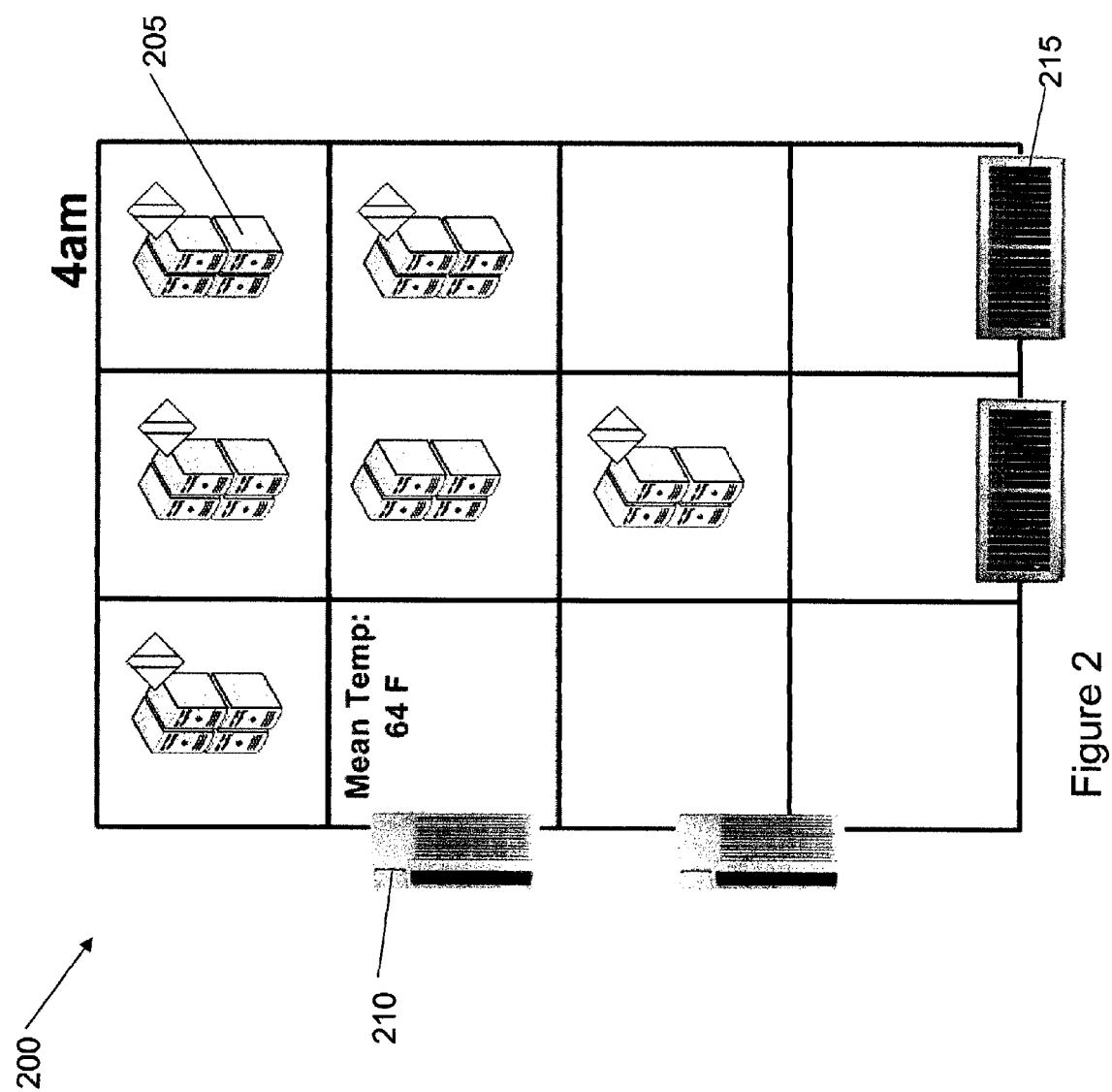
FIGS. 2-4 show an exemplary data center proactive cooling process in accordance with the invention.
Figure 3:
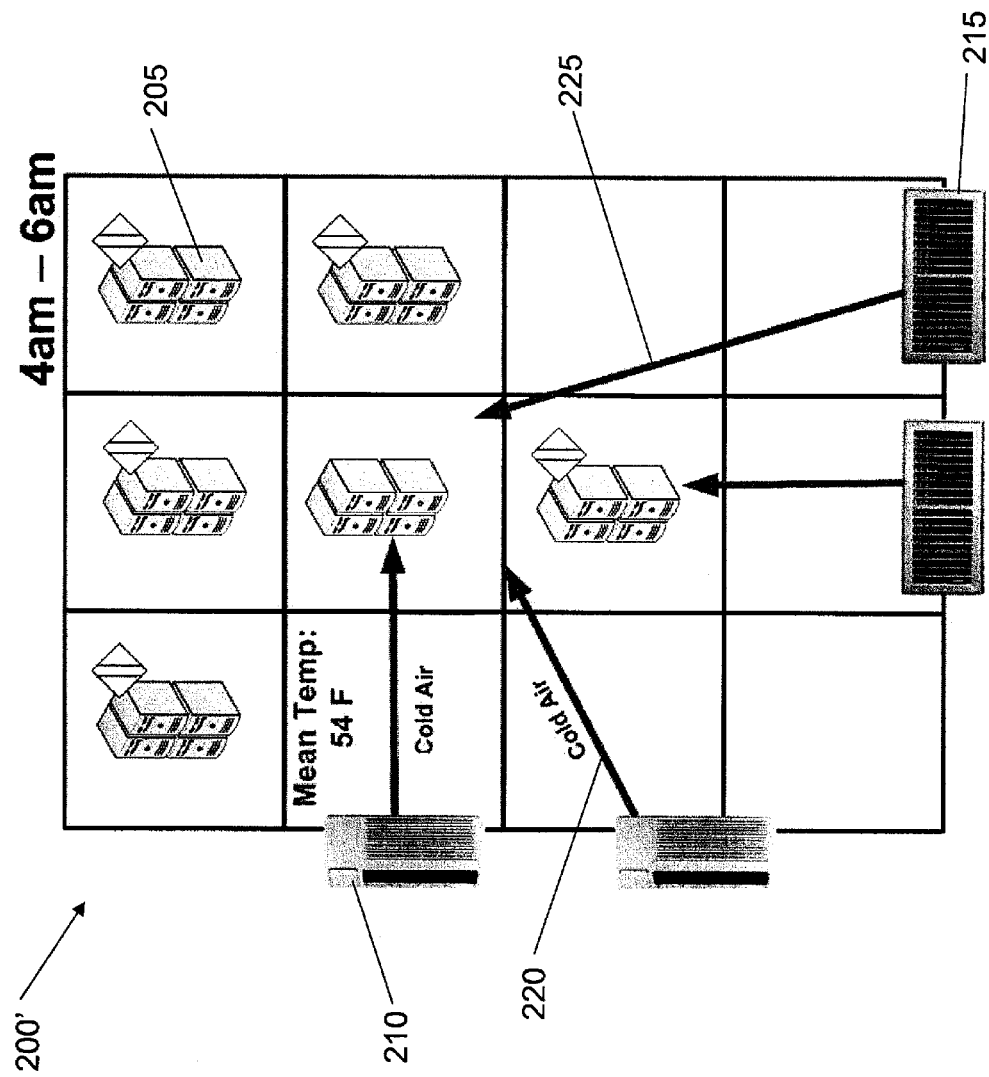
Figure 4:
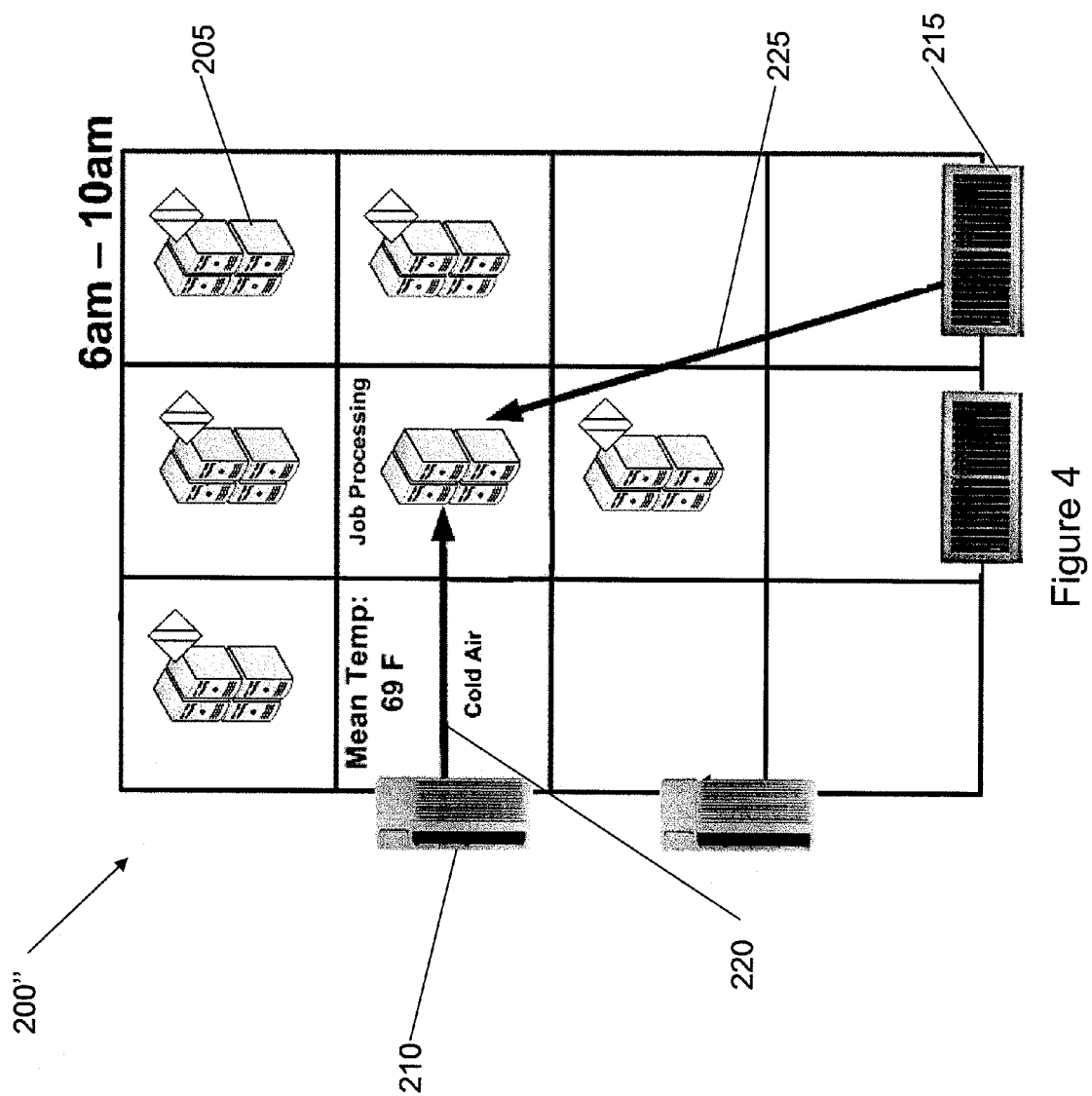

FIGS. 2-4 show an exemplary instance of a pre-cooling of a data center according to aspects of the invention. As shown in FIGS. 2-4, a data center 200 includes IT processing equipment 205, e.g., computers, servers, etc. Additionally, the data center 200 includes an HVAC system comprising, e.g., a plurality of air conditioners 210 and a plurality of air supplies 215. As should be understood, the air conditioners 210 may cool the air in the data center, whereas the air supplies, e.g., fans, ducts, vents, etc., may assist in distributing the cool air throughout the data center during cooling and assist in convection cooling of the IT processing equipment 205. Additionally, it should be understood that the air supplies 215 may be less expensive to operate as compared to the air conditioners 210.

As shown in the example of FIG. 2, the current time in the data center is 4 AM. In embodiments, the HVAC control tool 55 may have an internal clock or may be connected to an external clock, such that the HVAC control tool 55 is aware of a current time in the data center. Continuing with the example, the job schedule monitoring tool 45 is aware of, e.g., a long running job that is to be executed beginning at 6 AM and will last a period of four hours. Additionally, as shown in FIG. 2, the environmental data monitoring tool 35 determines via the environmental sensors 60, e.g., thermometers, that the mean temperature within the data center is, for example, 64 degrees Fahrenheit.

Additionally, as should be understood, the HVAC control tool 55 may utilize other environmental data in addition to temperature, to determine an appropriate amount of proactive cooling. For example, the HVAC control tool 55 may utilize time of day data, mean temperature within a data center region data, humidity data, moisture data, airflow data, carbon emissions data and outside (ambient) temperature data, amongst other data to determine an appropriate amount of cooling. Accordingly, the environmental data monitoring tool 35 may determine via the environmental sensors 60 mean temperature within a data center region, humidity, moisture, airflow, carbon emissions humidity data, time of day and/or outside (ambient) temperatures, amongst other data.

Moreover, based on, for example, historical data and/or snapshots stored in, e.g., the storage system 22B, the environmental data monitoring tool 35 may determine that without cooling during this four-hour job cycle, the mean temperature will rise to, e.g., 78 degrees Fahrenheit within the region of the data center where this IT processing equipment 205 is located. With this example, there is a concern that any temperature above 74 degrees may result in, e.g., a disk failure.

FIG. 3 shows the data center 200' during the hours of 4 AM and 6 AM. According to an aspect of the invention, with this example, the energy cost monitoring tool 45 determines that the energy costs between 4 AM and 6 AM are, for example, thirty percent lower that they are between the hours of 6 AM to 4 PM. Accordingly, as shown in FIG. 3, the HVAC control tool 55 instructs the HVAC system 75 to proactively cool the data center. More specifically, in embodiments, the HVAC control tool 55 may, for example, direct the air conditions 210 of the HVAC system 75 to proactively blow cold air 220 into the data center. Additionally, the HVAC control tool 55 may direct the air supplies 215, e.g., fans, ducts, vents, etc., of the HVAC system 75 to blow air 225, e.g., unconditioned air or ambient air, into the data center to assist in distributing the cold air 220 throughout the region of the data center. As shown in FIG. 3, by 6 AM the HVAC system 75 has lowered the mean temperature within the data center region to, e.g., 54 degrees Fahrenheit.

It should be understood that, while in the example of FIG. 3, the HVAC system 75 comprises two air conditioners 210 and two air supplies 215, the invention contemplates that a data center 200' may have any number of air conditioners 210 and air supplies 215. Moreover, it should be understood, while in the example of FIG. 3, the HVAC system 75 has activated two air conditioners 210 and two air supplies 215, the HVAC control tool 55 may activate any number of air conditioners 210 and/or air supplies 215 as is deemed necessary based on the current data center temperature, the desired data center temperature and the environmental and work load factors, amongst other factors.

Thus, as shown in FIG. 3, due to the proactive cooling, at 6 AM the mean temperature of the data center (or a region of the data center) has been lowered from 64 degrees Fahrenheit to 54 degrees Fahrenheit. Moreover, according to an aspect of the invention, via direction of the HVAC control tool 55, the temperature of the data center was lowered during optimal energy usage (e.g., during periods of lower energy costs) using a multivariate analysis to determine when and how much cool air was needed to lower the mean temperature. As described above, the variables for this analysis may include, for example, the energy costs, physical location (e.g., X, Y and Z coordinates) of regions of the data center and/or IT processing equipment in the data center, job scheduling, future application workload and the environmental data, amongst other variables.

FIG. 4 shows the data center 200" during the hours of 6 AM and 10 AM when the scheduled job is now processing. As should be understood, the IT equipment 205 that is executing the scheduled job may produce heat which may raise the temperature of the data center 200". However, due to the lower mean temperature of 54 degrees Fahrenheit when the job began, the mean temperature of the data center during the job processing between 6 AM-10 AM has only risen to 69 degrees Fahrenheit, whereas, it would have risen much higher if proactive steps were not taken by the present invention.

Moreover, according to a further aspect of the invention, as shown in FIG. 4, only one air conditioner 210 is operating and only one air supply 215 is operating. That is, with this example, the HVAC control tool 55 has determined that only one air conditioner 210 and one air supply 215 is necessary to maintain the data center at the appropriate temperature, e.g., 69 degrees Fahrenheit or below a temperature at which damage may occur, e.g., 74 degrees Fahrenheit. As such, the energy requirements for cooling during the job processing between 6 AM-10 AM, when energy costs are higher, was reduced through the proactive cooling. That is, the HVAC system 75 did not require as much power and energy usage during the job processing time. Accordingly, the associated costs for cooling the data center 200" during the job processing time are decreased. Moreover, the entire power and energy usage for cooling the data center 200" for the particular scheduled job may be less as a portion of the cooling was conducted during a period of lower energy costs. Additionally, according to a further aspect of the invention, during the job processing time, the HVAC control tool 55 may determine the next time to optimize the data center region to proactively cool an area to lower energy usage throughout the data center.

According to a further aspect of the invention, in embodiments, during a proactive cooling period, the HVAC control tool 55 may only activate one or more air conditioners 210 without utilizing the air supplies 215. That is, in embodiments, the air supplies 215 may not be used during the proactive cooling and may only be used during the job processing period to maintain a desired temperature and aid in the convection cooling of the IT processing equipment 205.

Flow Diagram

Figure 5:
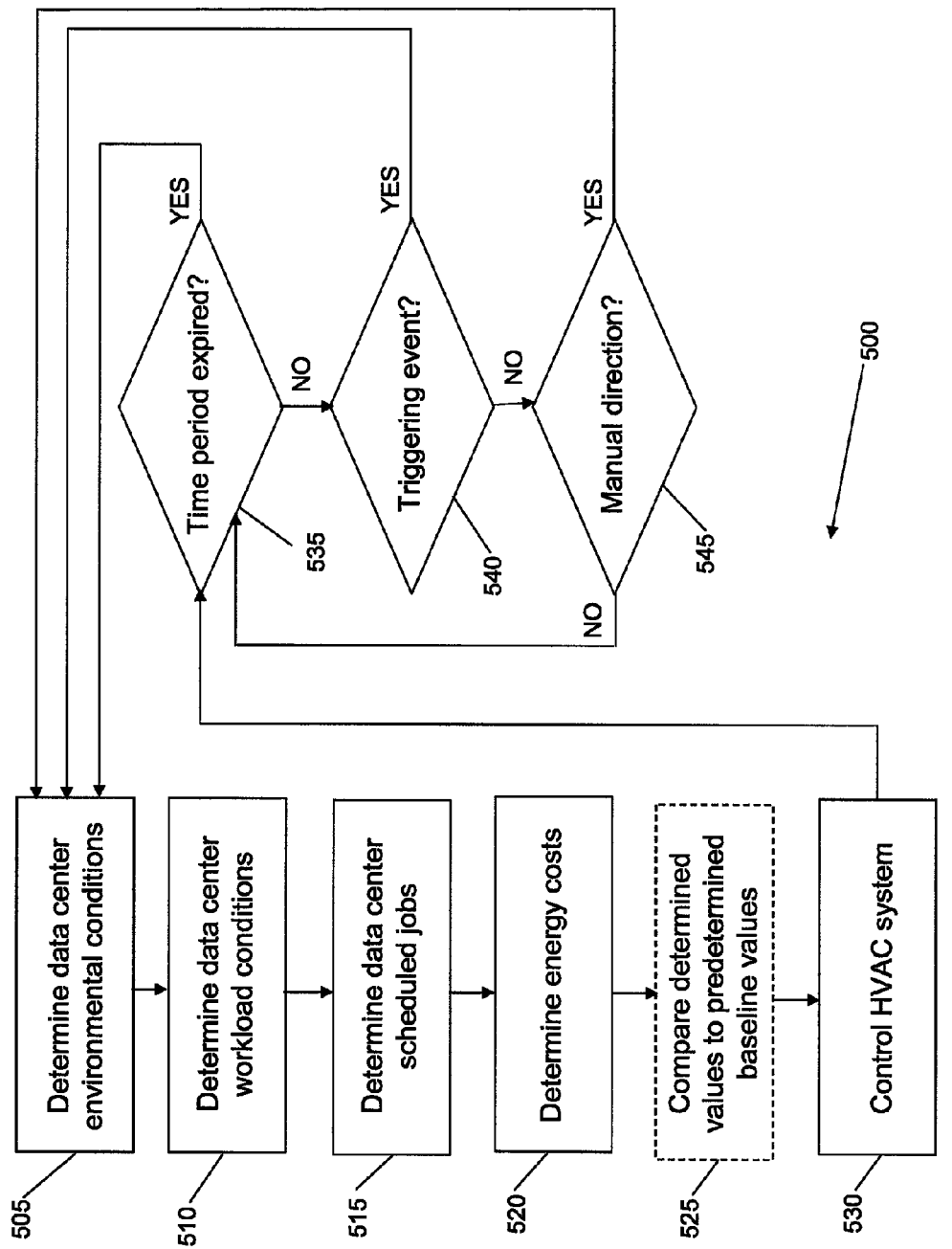
FIG. 5 shows an exemplary flow diagram for implementing aspects of the present invention.

FIG. 5 shows an exemplary flow 500 for performing steps of the invention. The steps of the flow diagram described herein may be implemented in the environment of FIG. 1. The flow diagram may equally represent a high-level block diagram of the invention. The steps of the flow diagram may be implemented and executed from either a server, in a client server relationship, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

As shown in FIG. 5, at step 505, the environmental data monitoring tool performs a thermal analysis of a data center to determine, e.g., hot and cold zones within the data center and forwards this thermal analysis to the HVAC control tool. It should be understood that the environmental data monitoring tool may also determine regions of higher and/or lower relative humidity, regions of higher and/or lower air flow and/or regions of higher and/or lower carbon emissions, amongst other environmental data. At step 510, the workload measurement tool determines a current data center workload and forwards this information to the HVAC control tool. At step 515, the job schedule monitoring tool tracks upcoming scheduled jobs and forwards this information to the HVAC control tool. At step 520, the energy cost monitoring tool determines a current energy cost or an estimated current energy cost and forwards this information to the HVAC control tool. In embodiments, the energy cost monitoring tool may perform a trending analysis to determine a current energy cost or an estimated current energy cost.

At step 525, the determined conditions may be compared to baseline conditions, e.g., baseline environmental conditions and/or baseline system conditions. It should be understood that step 525 is an optional step, as indicated by the phantom lines. At step 530, the HVAC control tool controls the HVAC system to, e.g., proactively cool the data center, based on the data received from the environmental data monitoring tool, the workload measurement tool, the job schedule monitoring tool and/or the energy cost monitoring tool.

At step 535, a determination is made as to whether a predetermined, user-configurable time period has expired. If, at step 535, it is determined that the time period has expired, then the process continues at step 505. If, at step 535, it is determined that the time period has not expired, then, at step 540, a determination is made as to whether a triggering event has occurred.

If, at step 540, it is determined a triggering event has occurred, then the process continues at step 505. If, at step 540, it is determined a triggering event has not occurred, then, at step 545, it is determined whether a manual direction for an updated analysis has occurred. If, at step 545, it is determined a manual direction has occurred, then the process continues at step 505. If, at step 545, it is determined a manual direction has not occurred, then the process continues at step 535.

It should be understood, that while the steps have been described as occurring in a particular order, the invention contemplates that the steps may be performed in other orders. For example, step 505 may occur after step 510. Furthermore, the invention contemplates that, in embodiments, steps may be implied or omitted while still remaining true to this invention.

Moreover, while the invention has been described using the environmental data monitoring tool 35, the workload measurement tool 40, the job schedule monitoring tool 45, the energy cost monitoring tool 50 and the HVAC control tool 55, the invention contemplates that any of the operations performed by the environmental data monitoring tool 35, the workload measurement tool 40, the job schedule monitoring tool 45, the energy cost monitoring tool 50 and the HVAC control tool 55 may be performed manually by a user (e.g., a data center employee). For example, in embodiments, a data center employee may manually monitor the job schedule and forward this information to the HVAC control tool 55.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method comprising:
    determining whether at least one data center condition that will cause a rise in a current temperature or a current mean temperature of at least one data center is anticipated to occur at a time frame subsequent to a current time;
    comparing the determined anticipated at least one data center condition to historical data to obtain similar past data center condition records;
    determining whether based on the similar past data center condition records that without cooling the at least one data center the anticipated at least one data center condition will cause the current temperature or the current mean temperature of the at least one data center to rise above a predetermined temperature;
    determining or estimating whether a current energy usage is optimal over an energy usage for the subsequent time frame when the anticipated at least one data center condition will cause the current temperature or the current mean temperature of the at least one data center to rise above the predetermined temperature;
    dynamically controlling a heating, ventilation and air conditioning (HVAC) system of the at least one data center in order to pre-cool the at least one data center if the current energy usage is optimal in anticipation of the at least one data center condition that will cause the current temperature or the current mean temperature to rise above the predetermined temperature; and updating the determined at least one data center condition, the determined or estimated current energy usage, and the dynamic control of the HVAC system, wherein the determining the at least one data center condition and the updating comprises:

receiving data center environmental data from at least one environmental sensor, receiving data center current workload information, and receiving data center scheduled jobs information.

2. The method of claim 1, wherein the at least one data center condition comprises at least one of:

an environmental condition;

a workload condition; and a job schedule condition.

3. The method of claim 2, wherein the environmental condition comprises at least one of: outdoor temperature; data center temperature; time of day; mean temperature within a data center region; humidity; moisture; airflow; and carbon emissions.

4. The method of claim 2, wherein the workload condition comprises at least one of: current workload levels; power usage; application priority; job scheduling; and application type.

5. The method of claim 2, wherein the job schedule condition comprises at least one of: a future workload level; application priority; job scheduling; and application type.

6. The method of claim 1, wherein the updating is performed based on at least one of:

an expiration of a predetermined time period;

a manual direction; and an occurrence of a triggering event.

7. The method of claim 6, wherein:

at least one of the determined at least one data center condition and the determined or estimated current energy usage is monitored in real-time, and the triggering event comprises a change in the at least one of the determined at least one data center condition and the determined or estimated current energy usage exceeding a previously determined data center condition value or a previously determined or estimated current energy usage value, respectively, by a predetermined threshold.

8. The method of claim 1, wherein the historical data comprises at least one of environmental and system snapshots to at least one of establish a baseline and perform the dynamic control of the HVAC system.

9. The method of claim 1, wherein:

the determining or the estimating the current energy usage comprises determining or estimating a current energy cost, and the determining or the estimating the current energy cost comprises at least one of:

receiving real-time energy demand information from at least one energy demand sensor and determining or estimating the current energy cost based on the real-time energy demand information; and maintaining a historical database of energy cost/demand data for the data center and determining or estimating the current energy cost based on the historical database of energy cost/demand data.

10. The method of claim 1, wherein a service provider at least one of creates, maintains, deploys and supports the computer infrastructure that performs the steps of claim 1.

11. The method of claim 1, wherein steps of claim 1 are provided by a service provider on a subscription, advertising, and/or fee basis.

12. The method of claim 1, further comprising dynamically controlling the HVAC system of the at least one data center during the time frame of the at least one data center condition to maintain the current temperature or the current mean temperature below the predetermined temperature.

13. The method of claim 12, further comprising delaying a start of the at least one data center condition in order to dynamically control the HVAC system of the at least one data center in order to pre-cool the at least one data center before the start of the at least one data center condition if the energy usage for the subsequent time frame is optimal in anticipation of the at least one data center condition that will cause the current temperature or the current mean temperature to rise above the predetermined temperature.

14. A system, comprising:

a processor, a computer readable memory and a computer readable storage media;

first program instructions to perform an environmental analysis of at least one data center;

second program instructions to determine a current data center workload for the at least one data center;

third program instructions to determine and track a scheduled data center job for the at least one data center;

fourth program instructions to determine or estimate a current energy cost for the at least one data center;

fifth program instructions to determine whether at least one of the environmental analysis, the current data center workload and the scheduled data center job will cause a rise in a current temperature or a current mean temperature of the at least one data center at a time frame subsequent to a current time;

sixth program instructions to compare the determined at least one of the environmental analysis, the current data center workload, and the scheduled data center job to historical data to obtain similar past data center environmental, workload, or job records;

seventh program instructions to determine whether based on the similar past data center environmental, workload, or job records that without cooling the at least one data center the at least one of the environmental analysis, the current data center workload and the scheduled data center job will cause the current temperature or current mean temperature to rise above a predetermined temperature;

eighth program instructions to determine or estimate whether the current energy cost is lower than an energy cost for the subsequent time frame when the at least one of the environmental analysis, the current data center workload and the scheduled data center job will cause the current temperature or the current mean temperature of the at least one data center to rise above the predetermined temperature;

ninth program instructions to dynamically control a heating, ventilation and air conditioning (HVAC) system of the at least one data center in order to pre-cool the at least one data center if the current energy cost is lower in anticipation of the at least one of the environmental analysis, the current data center workload and the scheduled data center job that will cause the current temperature or the current mean temperature of the at least one data center to rise above the predetermined temperature; and tenth program instructions to update the determined at least one of the environmental analysis, the current center workload, and the schedule data center job, the determined or estimated current energy cost, and the dynamic control of the HVAC system, wherein the determined at least one of the environmental analysis, the current center workload, and the schedule data center job, and the updating comprises:
  receiving data center environmental data from at least one environmental sensor,
  receiving data center current workload information, and
  receiving data center scheduled jobs information; and
wherein the first-tenth program instructions are stored on the computer readable storage media for execution by the processor via the computer readable memory.

15. The system of claim 14, comprising a computer infrastructure operable to implement the environmental data monitoring tool, the workload measurement tool, the job schedule monitoring tool, the energy cost monitoring tool and the HVAC control tool.

16. The system of claim 15, wherein a service provider at least one of creates, maintains, deploys and supports the computer infrastructure.

17. The system of claim 14, wherein the system is operable on software, hardware or a combination of software and hardware.

18. A computer program product comprising a computer usable non-transitory medium having readable program code embodied in the memory, the computer program product includes at least one component operable to:
  determine whether at least one data center condition that will cause a rise in a current temperature or a current mean temperature of at least one data center is anticipated to occur at a time frame subsequent to a current time;
  compare the determined anticipated at least one data center condition to historical data to obtain similar past data center condition records;
  determine whether based on the similar past data center condition records that without cooling the at least one data center the anticipated at least one data center condition will cause the current temperature or the current mean temperature of the at least one data center to rise above a predetermined temperature;
  determine or estimate whether a current energy usage is optimal over an energy usage for the subsequent time frame when the anticipated at least one data center condition will cause the current temperature or the current mean temperature of the at least one data center to rise above the predetermined temperature;
  dynamically control a heating, ventilation and air conditioning (HVAC) system of the at least one data center in order to pre-cool the at least one data center if the current energy usage is optimal in anticipation of the at least one data center condition that will cause the current temperature or the current mean temperature to rise above the predetermined temperature; and
  update the determined at least one data center condition, the determined or estimated current energy usage, and the dynamic control of the HVAC system,
  wherein:
    the determining the at least one data center condition and the updating comprises:
      receiving data center environmental data from at least one environmental sensor,
      receiving data center current workload information, and
      receiving data center scheduled jobs information;
    the determining or estimating the current energy usage comprises determining or estimating a current energy cost; and
    the determining or estimating the current energy cost comprises:
      receiving real-time energy demand information from at least one energy demand sensor and determining or estimating the current energy cost based on the real-time energy demand information, and
      maintaining a historical database of energy cost/demand data for the data center and determining or estimating the current energy cost based on the historical database of energy cost/demand data.

19. A method comprising the computer implemented steps of:
  determining a current time of day for at least one data center;
  determining a current temperature or a current mean temperature for the at least one data center;
  determining whether at least one adverse data center condition that will cause a rise in the current temperature or the current mean temperature is anticipated to occur at a time frame subsequent to the current time;
  comparing the determined anticipated at least one adverse data center condition to historical data to obtain similar past adverse data condition records;
  determining whether based on the similar past adverse data condition records that without cooling the at least one data center the determined anticipated at least one adverse data center condition will cause the current temperature or the current mean temperature for the at least one data center to rise above a predetermined temperature;
  determining or estimating whether a current energy cost is lower than an energy cost for the subsequent time frame when the anticipated at least one adverse data center condition will cause the current temperature or the current mean temperature for the at least one data center to rise above the predetermined temperature;
  dynamically controlling a heating, ventilation and air conditioning (HVAC) system of the at least one data center in order to pre-cool the at least one data center if the current energy cost is lower in anticipation of the at least one adverse data center condition that will cause the current temperature or the current mean temperature to rise above the predetermined temperature; and
  updating the determined at least one adverse data center condition, the determined or estimated current energy cost, and the dynamic control of the HVAC system,
  wherein:
    the updating the determined at least one adverse data center condition, the determined or estimated current energy cost and the dynamic control of the HVAC system based on at least one of:
      an expiration of a predetermined time period,
      a manual direction,
      an occurrence of a triggering event; and
    the determining the at least one adverse data center condition and the updating comprises:
      receiving data center environmental data from at least one environmental sensor,
      receiving data center current workload information, and
      receiving data center scheduled jobs information.

* * * * *